United States Patent [19]

Geissler et al.

[11] Patent Number: 4,695,527
[45] Date of Patent: Sep. 22, 1987

[54] RADIATION-POLYMERIZABLE COMPOSITION AND PROCESS FOR THE APPLICATION OF MARKINGS TO A PRINTED CIRCUIT BOARD

[75] Inventors: Ulrich Geissler, Frankfurt am Main; Heide Lampas, Hochheim, both of Fed. Rep. of Germany

[73] Assignee: Hoechst Aktiengesellschaft, Frankfurt am Main, Fed. Rep. of Germany

[21] Appl. No.: 875,190

[22] Filed: Jun. 17, 1986

Related U.S. Application Data

[62] Division of Ser. No. 717,101, Mar. 28, 1985, abandoned.

[30] Foreign Application Priority Data

Apr. 6, 1984 [DE] Fed. Rep. of Germany ....... 3412992

[51] Int. Cl.$^4$ .................. G03C 5/00; G03C 11/12
[52] U.S. Cl. .................. 430/256; 430/312; 430/327; 430/330; 430/394; 430/319; 430/292
[58] Field of Search ............. 430/312, 327, 330, 394, 430/319, 256, 292

[56] References Cited

U.S. PATENT DOCUMENTS

| | | | |
|---|---|---|---|
| 3,956,043 | 5/1976 | Zahir et al. | 430/319 X |
| 4,054,479 | 10/1977 | Peiffer | 430/319 X |
| 4,157,407 | 6/1979 | Peiffer | 430/319 X |
| 4,425,209 | 1/1984 | Saeki et al. | 204/159.23 |
| 4,438,189 | 3/1984 | Geissler et al. | 430/280 |
| 4,485,304 | 11/1984 | Herwig et al. | 430/260 |
| 4,587,199 | 5/1986 | Bennett | 430/260 |

FOREIGN PATENT DOCUMENTS

| | | |
|---|---|---|
| 1148015 | 6/1983 | Canada . |
| 0131299 | 1/1985 | European Pat. Off. . |
| 2032939 | 5/1980 | United Kingdom . |

*Primary Examiner*—John E. Kittle
*Assistant Examiner*—Cynthia Hamilton
*Attorney, Agent, or Firm*—Schwartz, Jeffery, Schwaab, Mack, Blumenthal & Evans

[57] ABSTRACT

A photopolymerizable composition is disclosed which comprises: (a) a free-radically polymerizable compound, (b) a polymeric binder, (c) a photopolymerization initiator, (d) a compound which is thermally cross-linkable with the polymeric binder, with a polymerization product of (a) or with itself, and (e) a pigment. The disclosed composition is used for applying markings to printed circuits and preferably is applied to the solder-resist layer using a dry-resist process, is exposed and then developed, either separately or together with the solder-resist layer.

18 Claims, No Drawings

RADIATION-POLYMERIZABLE COMPOSITION AND PROCESS FOR THE APPLICATION OF MARKINGS TO A PRINTED CIRCUIT BOARD

This is a division of application Ser. No. 717,101, filed Mar. 28, 1985, abandoned.

BACKGROUND OF THE INVENTION

The present invention relates to a photopolymerizable composition which can be applied, particularly in the form of a dry-resist layer, to the surface of a printed circuit, especially to a solder-resist layer, and which is capable of being processed into visible markings.

The surface of printed circuits, to which compounds are to be applied, is often provided with markings or characters that assist in the application procedure. Markings are usually applied to a solder resist which has been coated upon the printed circuit board, leaving the solder pads uncovered. Basically, pigmented marking resists, which are applied according to the screen-printing process, are used for this purpose.

The marking resist must have a high adhesive strength with respect to the base, in particular to the solder resist. The best results are obtained with two-component resists. However, the usable life or pot life of a two-component resist after mixing generally is no longer than 6 to 8 hours, i.e., the resist can only be used within this period of time. After this time, the mixture will gelatinize and become solid. Marking resists have been used that are based on printing inks which are curable by ultraviolet light, but to date the desired adhesive strength has not been attained with resists of this kind. When these resists are printed on a completely polymerized solder resist having a high surface gloss, the possibility of anchoring is reduced.

In addition, the resistance of markings cured by ultraviolet light is often insufficient under the conditions of subsequent processing, which can include, for example, a soldering step and a subsequent cleaning, under the action of ultrasonic waves, using aggressive chemicals and cleansing agents. Settling of the pigment in storage is also a disadvantage. Moreover, in many cases where only small numbers of workpieces have to be marked, it is too expensive to prepare a screen-printing stencil solely for marking.

On the other hand, it is known, for example, from U.S. Pat. No. 4,438,189, to produce solder masks according to the dry-resist process. In this process, a photopolymerizable layer comprising polymeric binders, polymerizable compounds, photoinitiators, and thermally activatable crosslinking agents is laminated onto a printed circuit, imagewise exposed, such that the solder pads are left unexposed, developed and then thermally cured. These layers usually contain a dye which renders the developed solder mask visible. It is also possible to add dyes which are bleached or which change color on exposure, in order to be able to differentiate between exposed and unexposed area. Care has to be taken, however, to prevent any adverse influence on the photosensitivity of the photopolymerizable layer. Therefore, dyes are used that absorb the smallest possible amount of light in the short-wave spectral region, and these dyes are added only in relatively low concentrations.

SUMMARY OF THE INVENTION

It is an object of the present invention to provide a radiation-polymerizable composition which can be used to produce a marking-resist layer which has a relatively high optical density but which still can be cured with exposures of practicable duration.

It is also an object of the present invention to provide a process for the application of markings to printed circuits, which process makes it possible to apply firmly adhering markings or characters to the surface of a printed circuit, i.e. to a solder mask, without having to prepare a screen-printing stencil, the markings being resistant to the conditions and treating operations of subsequent processing stages such as, for example, soldering and cleaning.

In accomplishing the foregoing objects, there has been provided, in accordance with one aspect of the present invention, a radiation-polymerizable composition which comprises (a) a compound which has at least two terminal ethylenically unsaturated groups and which is capable of forming a crosslinked polymer by means of addition chain polymerization initiated by free radicals; (b) a polymeric binder; (c) a radiation-activatable polymerization initiator which forms free radicals; (d) a compound which is thermally crosslinkable with at least one from the group consisting of a polymerization product of the compound (a), the polymeric binder (b), and the compound (d) itself; and (e) a finely-divided pigment which is dispersible in the composition.

In accordance with another aspect of the present invention, there has been provided a process for the application of markings to a printed circuit board, comprising the steps of (a) laminating under pressure a solid thermoplastic photopolymerizable layer onto the printed circuit board, the photopolymerizable layer (i) containing a finely-divided pigment which contrasts in color with the surface of the printed circuit board and (ii) being provided on a transparent, flexible temporary support; (b) imagewise exposing the photopolymerizable layer through a negative of the markings; (c) peeling the temporary support from the photopolymerizable layer; and (d) treating the photopolymerizable layer in a developer to dissolve unexposed areas of the photopolymerizable layer. In one preferred embodiment, said printed circuit board comprises a supported solder-resist layer to which said photopolymerizable layer is laminated. In another preferred embodiment, step (d) of the above-described process comprises developing the exposed solder-resist layer and the photopolymerizable layer in a single operation.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

As noted above, the radiation-polymerizable composition of the present invention comprises, inter alia, a finely-divided pigment which is dispersible in the composition. Component (d) of the composition can be absent, if the binder comprises crosslinking groups, by means of which the binder is capable of thermally crosslinking with itself or with the polymerization product of the above-mentioned unsaturated compound (a). In that case, the binder (b) and component (d) are represented by one and the same compound.

Any form of electromagnetic radiation, the energy of which is sufficient to trigger polymerization, can be used as an actinic radiation to which the composition according to the invention is sensitive. Particularly suitable are visible and ultraviolet light, x-rays, and electron radiation. Laser radiation in the visible and in the ultraviolet region can also be used. Short-wave visible and long-wave ultraviolet light is preferred.

The polymerizable compounds used in the present invention are, in general, esters of acrylic or methacrylic acid with polyhydric, preferably primary, alcohols. The alcohol should comprise from 2 to about 4 hydroxyl groups, since the crosslinking action desired is achieved by polyunsaturated compounds. The composition can also include minor quantities of esters of monohydric alcohols or of alcohols which have more hydroxyl groups. Examples of suitable polyhydric alcohols are ethylene glycol, propylene glycol, butane-1,4-diol, butane-1,3-diol, diethylene glycol, triethylene glycol, polyethylene glycols and polypropylene glycols having molecular weights from about 200 to about 1,000, neopentylglycol, trimethylolethane, trimethylolpropan, pentaerythritol and oxyethylated bisphenol A derivatives. Low-molecular bis-acrylates and bis-methacrylates which comprise urethane groups and which are obtained by reacting 2 moles of a hydroxyalkyl acrylate or hydroxyalkyl methacrylate with 1 mole of an aliphatic or cycloaliphatic diisocyanate, for example, 2,2,4-trimethylhexamethylene diisocyanate, are also suitable. Monomers of this type, containing urethane groups, are described in U.S. Pat. No. 4,088,498. Similar suitable monomers are described in European Patent Applications No. 5,750 and No. 73,444.

Mixtures of various monomers can also be used. It is, for example, possible to combine monomers of the above-mentioned type with higher-molecular weight monomers which comprise urethane groups and which are represented by the general formula:

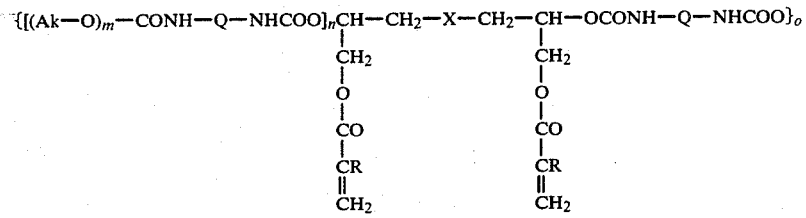

in which
Q is a bivalent mononuclear or binuclear aromatic radical which is unsubstituted or substituted by lower alkyl groups and which can contain a lower alkylene group as a connecting member,
X is one of the groups —O—Ph—X'—Ph—O— and 'OOC—$(CH_2)_y$—COO—, wherein Ph is an optionally substituted phenylene group, X' is an alkylene group having from 1 to 4 carbon atoms and y is a number from 2 to 12.
R is a hydrogen atom or a methyl group,
Ak is an alkylene radical having from 2 to 4 carbon atoms,
m is a number from 4 to 50,
n is a number from 1 to 6, and
o is a number from 4 to 20.

These polyether ester urethanes are prepared in a known manner by reacting oligomeric diisocyanates corresponding to the formula:
OCN—Q—[NHCOO—(AkO)$_m$CONH—Q—]$_n$NCO
with bis-acrylic ester diols corresponding to the formula:

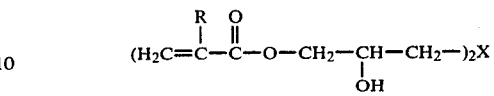

The preparation and use of these compounds is described in European Patent Application No. 48,913.

The above-described polyurethanes, in general, have reduced specific viscosities (RSV) of about 0.15 to 1.4 dl/g, measured on 1% strength solutions in dimethyl formamide at 25° C. Products having RSV values within a range from 0.2 to 0.9 dl/g are preferred. Also preferred are the following average values: m from about 8 to 20, n from about 2 to 4, o from about 5 to 12, and y from about 2 to 6.

X' is an alkylene group, in which the free valences are preferably attached to a carbon atom. Preferred groups include methylene groups, 1,1-ethylene groups, and 2,2-propylene groups. R preferably is a methyl group.

The total amount of polymerizable compounds is, in general, between 10 and 50, preferably between about 15 and 45 percent by weight, relative to the nonvolatile constituents of the radiation-polymerizable composition. Of this amount, 2 to 20, preferably 5 to 10, percent by weight, relative to the same nonvolatile constituents, can include polyurethanes of the general formula given above.

The compositions according to the present invention also contain a polymeric, preferably saturated binder. Water-insoluble binders which are soluble, or at least swellable, in aqueous-alkaline solutions are preferably used. As groups which impart solubility in alkali, the binders can contain phosphonic acid groups, sulfonic acid groups, sulfonamide groups, sulfonyl urethane groups, carboxylic anhydride groups and, preferably, carboxyl groups. Preferred binders are copolymers of methacrylic acid and alkyl methacrylates and, optionally, also styrene or other comonomers, as described in German Offenlegungsschriften No. 2,064,080 and No. 2,363,806. Particularly preferred binders have thermally crosslinkable side groups, for example, groups corresponding to the formula —CH$_2$OR, in which R stands for a hydrogen atom or a lower alkyl group or acyl group. The groups can be attached to oxygen or nitrogen atoms, for example, in units of acrylamide or methacrylamide, acrylates or methacrylates. Binders of this kind are described in U.S. patent application Ser. No. 640,139, filed Aug. 13, 1984, for example, terpolymers of methacrylic acid, alkyl methacrylates and N-alkoxymethyl methacrylamides. The binders are used in an amount of 40 to 80, preferably 50 to 70, percent by weight, relative to the nonvolatile constituents of the composition.

A large number of substances can be used as photoinitiators in the composition according to the present invention. Examples include benzoin and its derivatives; polynuclear quinones; trichloromethyl-s-triazines; carbonyl methylene heterocycles, such as 2-(p-trichloromethyl-benzoylmethylene)-3-ethyl-benzothiazoline, which contain trihalogenomethyl groups, acridine derivatives, for example, 9-phenylacridine, 9-p-methoxyphenyl-acridine, 9-acetylamino-acridine and benz(a)acridine; phenazine derivatives, for example, 9,10-dimethylbenzo(a)phenazine, 9-methyl-benzo(a)phenazine and 10-methoxybenzo(a)phenazine; quinoxaline derivatives, for example, 6,4',4''-trimethoxy-2,3-diphenyl-quinoxaline, 4'4''-dimethoxy-2,3-diphenyl-5-azaquinoxaline; and quinazoline derivatives. Acridine, phenazine and quinoxaline derivatives are preferred. The photoinitiators, in general, are present in an amount of from 0.01 to 10 percent by weight, preferably from 0.05 to 2 percent by weight.

Additionally, the compositions according to the present invention contain about 1 to 30 percent by weight of an inorganic or organic pigment. The amount of pigment depends on the type of pigment used and on the layer thickness, and is preferably in the range between 5 and 15 percent by weight, particularly at a layer thickness of about 25 μm. The inorganic pigments include, for example, oxide and hydroxide pigments (such as titanium dioxide and zinc oxide), sulfide pigments (for example, zinc sulfide and cadmium pigments), and chromate pigments (for example, chrome yellow, chrome orange and zinc yellow). Examples of organic pigments are monoazo and bisazo pigments, sparingly soluble salts of anionic azo dyes, sparingly soluble salts of cationic dyes, copper phthalocyanins and other metal-complex pigments, and pigments selected from the group consisting of carbonyl dyes, azine pigments and dioxazine pigments.

Preferably, the compositions additionally contain small amounts of a dye which changes its color on irradiation, such that the image is discernible in the layer immediately after exposure. Suitable examples of dyes which change color on exposure are triphenylmethane dyes and certain azo dyes, as described in German Offenlegungsschrift No. 2,807,933 (corresponding to U.S. Pat. No. 4,241,166).

Suitable compounds which are thermally cross-linkable with the binder, with the polymerization product of the ethylenically unsaturated compound and/or with themselves preferably include compounds in which the crosslinking groups comprise epoxy groups or groups corresponding to the formula —$CH_2$—O—R, in which R is a hydrogen atom, a lower alkyl group, an acyl group, or a hydroxyalkyl group and in which the groups —$CH_2OR$ are attached to a nitrogen atom of a non-cyclic or cyclic acid amide or to an aromatic carbon atom of a compound which is capable of condensation with formaldehyde. The organic radicals R generally have from 1 to 4, preferably 1 or 2, carbon atoms.

Derivatives of cyclic acid amides, for example, of melamine, particularly hexaalkoxymethyl melamine, are preferably used.

The crosslinking compounds are usually contained in the composition in an amount ranging from about 0.5 to 30, preferably from 5 to 25, percent by weight, relative to the nonvolatile constituents of the composition.

The compositions according to the present invention can also contain, in addition to monomers, binders, photoinitiators, crosslinking agents, and pigments, various other customary additives, for example, inhibitors to prevent the thermopolymerization of the monomers, hydrogen donors, sensitometric regulators, flame retardants and plasticizers.

The radiation-polymerizable composition according to the present invention is preferably used as a marking resist. For this purpose, the composition can be applied in a known manner from a solution (or dispersion) or as a prefinished transferable dry-resist film to a printed circuit board, which is preferably covered by a solder mask. The composition is preferably processed in the form of a dry resist material. In general, a solution of the composition in a solvent is applied to a suitable support, for example, a polyester film, and dried. The layer thickness of the resist layer can be about 10 to 50 μm, preferably about 20 to 30 μm. The free surface of the layer is preferably covered with a covering film, for example, of polyethylene or polypropylene.

Even after months of storage at 20° C., the resist rolls remain unchanged and can be processed without problems, and the cut edges remain completely free of resist outflows which lead to sticking. Resist layers stored for more than 2 months at 40° C. in a drying cabinet show no differences, compared to freshly prepared layers, with respect to laminatability, developability and soldering resistance.

The dry-resist films prepared in accordance with the present invention can be processed by means of equipment customary in the dry-resist technique. In a commercially available laminating device, the covering film is peeled off and the marking-resist layer is laminated onto a printed circuit board which has been coated with a solder-resist layer and has been exposed through an original. It is also possible to laminate the marking-resist layer onto a printed circuit board covered with a developed solder mask. The board so prepared is then exposed through an original such that only the layer areas which are intended to form the markings are struck by light.

The resist layers, after being freed from the support film, are developed in a known manner. In the process, the solder-resist layer and the marking-resist layer are either developed together or the marking-resist layer is developed separately. Suitable developers are aqueous, preferably aqueous-alkaline, solutions, for example, of alakli metal phosphates, alkali metal carbonates or alkali metal silicates, to which can be added, if desired, small amounts, for example, up to about 10 percent by weight, of wetting agents or organic solvents which are miscible with water.

The printed circuit boards provided with solder mask and markings must be subjected to a heat treatment before the soldering process is carried out. It is assumed that, in this treatment, an interpenetrating network is formed which is responsible for good mechanical, thermal and chemical resistance. The thermal treatment is, in general, carried out at temperatures between 130° C. and 150° C., for periods of about 30 to 60 minutes.

After the application of markings and component-identifications with the aid of the marking resist, electronic devices can be inserted on the printed circuit board. The board can thereafter be treated with a suitable, commercially available soldering flux and then soldered in a commercially available wave soldering machine.

With the aid of the resist technique of the present invention, markings and component identifications can rapidly and accurately be applied to printed circuit boards. The marking resist possesses a good adhesion, in particular with respect to solder masks, is stable at the usual soldering temperatures, and also shows an adequate resistance to chemicals, cleansing agents and ultrasonic treatment. Unexpectedly, the marking-resist layer which contains a relatively high proportion of pigment and, consequently, has a high optical density, is nevertheless cured within reasonable exposure times to such an extent that even small symbols are not washed away from the solder-resist layer upon developing.

The examples which follow illustrate particular embodiments of the composition according to the present invention. Unless otherwise indicated, percentages and quantity ratios are to be understood as units by weight. The quantities in the formulations are given in parts by weight (p.b.w.).

EXAMPLE 1

In a corundum mill, 3 p.b.w. of titanium dioxide (Kronos RNCX, manufactured by Kronos Titan GmbH) were intimately mixed with 14 p.b.w. of a 30% strength solution of a styrene/hexylmethacrylate/methacrylic acid copolymer (10:60:30% by weight) in butanone.

The dispersion thus obtained was then admixed with the following components while stirring:
29.33 p.b.w. of the above-indicated 30% strength terpolymer solution,
1.6 p.b.w. of an elastomeric reaction product of glycidyl methacrylate, adipic acid, and an oligomeric diisocyanate, obtained by reacting tolylene diisocyanate with a poly-butane-1,4-diol (see German Offenlegungsschrift No. 3,036,694),
7.4 p.b.w. of polyethylene glycol 400 dimethacrylate,
0.01 p.b.w. of 9-phenylacridine,
1.0 p.b.w. of hexamethoxymethyl melamine,
0.0075 p.b.w. of a blue azo dye, obtained by coupling 2,4-dinitro-6-chlorobenzenediazonium salt with 2-methoxy-5-acetylamino-N,N-diethylaniline, and
11 p.b.w. of ethanol.

The indicated solution was coated in a continuous manner upon a biaxially stretched and heat-set 25 μm thick polyethylene terephthalate film. After passing through a drying zone, the resist layer had a thickness of 25 μm and was covered with a polypropylene film.

After peeling off the polypropylene film, a commercially available laminating device was used to laminate the dry-resist layer at 115° C. (a) onto a printed circuit board which had been coated with a photopolymerizable solder-resist layer and exposed through an original.

The photopolymerizable solder-resist layer had the following composition:
13 p.b.w. of a terpolymer of n-hexyl methacrylate, methacrylic acid and styrene (60:30:10), having an average molecular weight of about 35,000 and an acid number of 195,
6.4 p.b.w. of polyethylene glycol 400 dimethacrylate,
1.6 p.b.w. of the above-indicated polymerizable elastomer,
0.2 p.b.w. of 9-phenylacridine,
0.41 p.b.w. of hexamethoxymethyl melamine,
0.01 p.b.w. of the above-indicated blue azo dye, and
0.03 p.b.w. of 1,4-bis-(4-tert-butoxyphenylamino)-5,8-dihydroxyanthraquinone.

In a second sample (b), the resist layer was laminated onto a printed circuit board which had been coated with a solder resist, and then exposed and developed.

The boards were exposed for 12 seconds in a commercially available exposure apparatus (5 kW metal halide lamp). The originals used were a negative of a marking print and a 13-step continuous tone step wedge having density increments of 0.15. After exposure, the boards were developed in a continuous developing apparatus, using a 1% strength sodium carbonate solution. Three completely crosslinked wedge steps were obtained. At a developer temperature of 30° C., the developing time for marking resist (b) was 60 seconds, while the simultaneous development of solder resist and marking resist (a) required 220 seconds.

The printed circuit boards so prepared were then baked for 60 minutes in a drying oven at 150° C. and thereafter soldered in a wave-soldering device. The soldered boards did not show any chipping off of the marking resist. Even extremely fine characters and numbers could not be detached by means of an adhesive tape.

EXAMPLE 2

A coating solution was prepared as indicated in Example 1, but in this case the polyethyleneglycol 400 dimethacrylate used in Example 1 was replaced by 7.4 p.b.w. of a mixture composed of that monomer and the reaction product obtained from 1 mole of triethylene glycol, 2 moles of 2,2,4-trimethylhexamethylene diisocyanate and 2 moles of hydroxyethylmethacrylate, in a weight ratio of 4.4:3.

The mixture was spin-coated upon a polyethylene terephthalate film in such a manner that a layer weight of 28 g/m² was obtained after drying at 100° C.

The marking resist was further processed as indicated in Example 1.

| | |
|---|---|
| exposure time: | 20 seconds |
| developing time: (1% strength sodium carbonate solution) | 100 seconds |
| number of crosslinked wedge steps: | 3 (4) |
| baking: | 60 minutes at 150° C. |

Also in this case, chipping off of the marking resist was not observed after soldering.

EXAMPLE 3

The following coating solutions were prepared:
(a) 39 p.b.w. of a terpolymer composed of 25% by weight of N-butoxymethyl methacrylamide, 25% by weight of methacrylic acid and 50% by weight of hexyl methacrylate,
9 p.b.w. of titanium dioxide as in Example 1,
9 p.b.w. of hexamethoxymethyl melamine,
16.2 p.b.w. of polyethylene glycol 400 dimethyacrylate,
0.0225 p.b.w. of the blue dye indicated in Example 1, and
0.03 p.b.w. of 9-phenylacridine in
100 p.b.w. of butanone and
20 p.b.w. of ethanol.
(b) 39 p.b.w. of the above-indicated terpolymer,
9 p.b.w. of titanium dioxide (as above),
3 p.b.w. of hexamethoxymethyl melamine,
22.2 p.b.w. of polyethylene glycol 400 dimethacrylate,
0.0225 p.b.w. of the blue dye of Example 1, and 0.03 p.b.w. of 9-phenylacridine in
100 p.b.w. of butanone and
20 p.b.w. of ethanol.

After mixing in a corundum mill, the coating solutions were, in each case, spin-coated upon a polyester film and dried (layer weight of 30 g/m$^2$). The material was further processed as described in Example 1(a), with the exception that, in this example, the marking-resist layers were laminated onto an exposed solder-resist layer having the following composition:

52 p.b.w. of a terpolymer of N-butoxymethyl methacrylamide, methacrylic acid and hexyl methacrylate (25:25:50),
17.6 p.b.w. of polyethylene glycol 400 dimethacrylate,
4 p.b.w. of hexamethoxymethyl melamine,
0.8 p.b.w. of 9-phenylacridine,
0.04 p.b.w. of the blue azo dye indicated in Example 1, and
0.12 p.b.w. of 1,4-bis-(4-tert-butoxy-phenylamino)-5,8-dihydroxyanthraquinone.

The optimum exposure time was 16 seconds for layer (a) and 12 seconds for layer (b). The number of completely crosslinked wedge steps obtained after developing was, in each case, 3 (4). The boards were then baked for 60 minutes at 150° C. The markings applied in this manner adhered excellently to the solder mask. Even after allowing ethanol to act for three days, separation of the marking resist was not observed. Resistance to the soldering bath was excellent.

Similar good results were obtained when titanium dioxide was replaced by the same amount of chrome yellow.

EXAMPLE 4

A solution comprised of:
39 p.b.w. of the terpolymer indicated in Example 1,
13 p.b.w. of an N-methoxymethyl methacrylamide/hexylmethacrylate copolymer (1:1),
8 p.b.w. of the polymerizable elastomer indicated in Example 1,
22 p.b.w. of polyethylene glycol 400 dimethacrylate,
12 p.b.w. of titanium dioxide as in Example 1,
5 p.b.w. of hexamethoxymethyl melamine,
1 p.b.w. of 9-phenylacridine,
0.03 p.b.w. of the blue azo dye of Example 1, and
210 p.b.w. of butanone,
was spin-coated upon a printed circuit board carrying an exposed solder-resist layer, in such a manner that a layer weight of 27 g/m$^2$ was obtained after drying. The board was further processed as indicated in Example 1(a) and the results obtained were similar to those of Example 1(a).

What is claimed is:

1. A process for the application of markings to a printed circuit board, comprising the steps of:
    (i) laminating under pressure a solid thermoplastic photopolymerizable layer onto a supported, imagewise-exposed and developed solder-resist layer of a printed circuit board, said photopolymerizable layer being provided on a transparent, flexible temporary support and comprising
        (a) a compound which has at least two terminal ethylenically unsaturated groups and which is capable of forming a crosslinked polymer by means of addition chain polymerization initiated by free radicals,
        (b) a polymeric binder,
        (c) a radiation-activatable polymerization initiator which forms free radicals,
        (d) a compound which is thermally crosslinked with at least one from the group consisting of a polymerization product of said compound (a), said polymeric binder (b) and said compound (d) itself, and
        (e) a finely-divided pigment which is dispersible in said photopolymerizable layer and which contrasts in color with the surface of said printed circuit board;
    (ii) imagewise exposing said photopolymerizable layer through a negative of said markings;
    (iii) peeling said temporary support from said photopolymerizable layer; and
    (iv) treating said photopolymerizable layer in a developer to dissolve unexposed areas of said photopolymerizable layer.

2. A process as claimed in claim 1, further comprising after step (iv) the step of heating said laminate such that an interpenetrating network is formed within said solder-resist layer and said photopolymerizable layer.

3. A process as claimed in claim 2, wherein said laminate is heated to a temperature between 130° C. and 150° C.

4. A process as claimed in claim 1, wherein said laminate is heated for a period of 30 to 60 minutes.

5. A process as claimed in claim 1, wherein said developer is an aqueous-alkaline solution.

6. A process as claimed in claim 1, wherein said binder (b) is a saturated polymer.

7. A process as claimed in claim 1, wherein said polymeric binder (b) is thermally crosslinkable with said compound (d).

8. A process as claimed in claim 1, wherein said compound (d) is a polymeric binder.

9. A process as claimed in claim 1, wherein said pigment is present in an amount from 1 to 30 percent by weight, relative to the nonvolatile constituents of said photopolymerizable layer.

10. A process for the application of markings to a printed circuit board, comprising the steps of:
    (i) laminating under pressure a solid thermoplastic photopolymerizable layer onto a supported, imagewise-exposed solder-resist layer of a printed circuit board, said photopolymerizable layer being provided on a transparent, flexible temporary support and comprising
        (a) a compound which has at least two terminal ethylenically unsaturated groups and which is capale of forming a crosslinked polymer by means of addition chain polymerization initiated by free radicals,
        (b) a polymeric binder,
        (c) a radiation-activatable polymerization initiator which forms free radicals,
        (d) a compound which is thermally crosslinkable with at least one from the group consisting of a polymerization product of said component (a), said polymeric binder (b) and said compound (d) itself, and
        (e) a finely-divided pigment which is disperible in said photopolymerizable layer and which contrasts in color with the surface of said printed circuit board;
    (ii) imagewise exposing said photopolymerizable layer through a negative of said markings;

(iii) peeling said temporary support from said photopolymerizable layer; and (iv) treating said photopolymerizable layer in a developer to dissolve unexposed areas of said photopolymerizable layer and of said exposed solder-resist layer, respectively.

11. A process as claimed in claim 10, further comprising after step (iv) the step of heating said laminate such that an interpenetrating network is formed within said solder-resist layer and said photopolymerizable layer.

12. A process as claimed in claim 11, wherein said laminate is heated to a temperature between 130° C. and 150° C.

13. A process as claimed in claim 11, wherein said laminate is heated for a period of 30 to 60 minutes.

14. A process as claimed in claim 10, wherein said developer is an aqueous alkaline solution.

15. A process as claimed in claim 1, wherein said binder (b) is a saturated polymer.

16. A process as claimed in claim 1, wherein said polymeric binder (b) is thermally crosslinkable with said compound (d).

17. A process as claimed in claim 1, wherein said compound (d) is a polymeric binder.

18. A process as claimed in claim 1, wherein said pigment is present in an amount from 1 to 30 percent by weight, relative to the nonvolatile constituents of said photopolymerizable layer.

* * * * *